US009784796B2

(12) United States Patent
Schleicher et al.

(10) Patent No.: US 9,784,796 B2
(45) Date of Patent: Oct. 10, 2017

(54) METHOD AND APPARATUS FOR DETERMINING AN OPERATING POINT-DEPENDENT CHANGE IN RESISTANCE FACTOR AND VEHICLE

(71) Applicant: Volkswagen Aktiengesellschaft, Wolfsburg (DE)

(72) Inventors: Jorg Schleicher, Wittgensdorf (DE); Sascha Drenkelforth, Hannover (DE); Martin Mener, Chemnitz (DE); Michael Clauss, Chemnitz (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 187 days.

(21) Appl. No.: 14/882,571

(22) Filed: Oct. 14, 2015

(65) Prior Publication Data
US 2016/0109528 A1 Apr. 21, 2016

(30) Foreign Application Priority Data

Oct. 15, 2014 (DE) ........................ 10 2014 220 914

(51) Int. Cl.
*G01N 27/416* (2006.01)
*G01R 31/36* (2006.01)

(52) U.S. Cl.
CPC ..... *G01R 31/3662* (2013.01); *G01R 31/3675* (2013.01)

(58) Field of Classification Search
CPC ............ G01R 31/3662; G01R 31/3648; G01R 31/3624; Y02E 60/12; H01M 10/48
USPC ........................................................ 324/430
See application file for complete search history.

(56) References Cited

U.S. PATENT DOCUMENTS

| 4,888,716 | A | 12/1989 | Ueno ............................. 364/550 |
| 7,012,434 | B2 | 3/2006 | Koch ............................. 324/427 |
| 7,332,892 | B2 | 2/2008 | Bopp et al. ................... 320/132 |
| 8,421,468 | B2 | 4/2013 | Ono et al. ...................... 324/430 |
| 2002/0022785 | A1* | 2/2002 | Romano .............. A61B 5/7239 600/526 |
| 2005/0017687 | A1* | 1/2005 | Nagaoka ................ H02J 7/0047 320/132 |
| 2005/0248282 | A1* | 11/2005 | Ito .......................... H05B 41/382 315/77 |
| 2010/0057412 | A1* | 3/2010 | Tanomura ........... G06F 17/5036 703/2 |

FOREIGN PATENT DOCUMENTS

| DE | 3712629 | 10/1987 | ............. B60R 16/04 |
| DE | 19540827 | 5/1996 | ............. H01M 10/42 |
| DE | 10257588 | 10/2004 | ............. G01R 31/36 |
| DE | 102007004488 | 7/2008 | ............. G01R 31/36 |
| DE | 102010043870 | 6/2011 | ............. G01R 31/36 |
| DE | 102011017113 | 10/2012 | ............. G01R 31/36 |
| DE | 102012204585 | 9/2013 | ............. G01R 31/36 |
| DE | 102012010487 | 11/2013 | ............. G01R 31/36 |
| DE | 102012022458 | 5/2014 | ............. G01R 31/36 |
| EP | 1380849 | 1/2004 | ............. G01R 31/36 |
| WO | WO 2006/057468 | 6/2006 | ............. H01M 10/44 |
| WO | WO 2012/171730 | 12/2012 | ............. G01R 31/36 |
| WO | WO 2013/178329 | 12/2013 | ............. G01R 31/36 |

* cited by examiner

*Primary Examiner* — Arun Williams
(74) *Attorney, Agent, or Firm* — Kusner & Jaffe (57) ABSTRACT

An apparatus and a method for determining an operating point-dependent change in resistance factor ($AF_{AP}$) of an energy storage device, wherein a start resistance is determined at an operating point start point in time, wherein a change in resistance between a present resistance of the energy storage device and the start resistance is determined at least at an operating point end point in time, wherein an end resistance is determined as a sum of the start resistance and the change in resistance determined at the operating point end point in time, wherein the operating point-dependent change in resistance factor ($AF_{AP}$) is determined as a ratio between the end resistance and a nominal resistance proportion of the start resistance, and to methods for determining an operating point-dependent resistance.

17 Claims, 4 Drawing Sheets

METHOD AND APPARATUS FOR DETERMINING AN OPERATING POINT-DEPENDENT CHANGE IN RESISTANCE FACTOR AND VEHICLE

FIELD OF THE INVENTION

The invention relates to a method and an apparatus for determining an operating point-dependent change in resistance factor of an energy storage device, and to a vehicle. Furthermore, the invention relates to a method and an apparatus for determining an operating point-dependent resistance of an energy storage device.

BACKGROUND OF THE INVENTION

Particularly in at least partly electrically operated vehicles, for example in electric vehicles and hybrid vehicles, provision is made of energy storage devices that store and provide the electrical energy required for driving operation.

The resistance of such an energy storage device constitutes an important characteristic value that serves in particular for determining a permissible power output. With increasing aging of the energy storage device, said resistance changes in this case, said resistance usually being determined on the test bed before the start-up of the energy storage device, that is to say at the so-called begin of life (BOL). After the initial start-up, the aging is crucially influenced by two criteria, namely the so-called cyclic aging and the so-called calendrical aging. However, the aging can be predicted only inaccurately on account of the different influencing factors. Moreover, nonuniform aging occurs at mutually different operating points.

In order to be able to determine e.g. the permissible power output accurately and reliably, it is desirable to ascertain the resistance as accurately as possible in each driving cycle of the vehicle and over the entire life cycle of the energy storage device.

In this case, it is desirable, in particular, to accurately determine the resistance already at the beginning of a driving cycle, in order to avoid an impermissible power release.

DE 102 57 588 B3 describes a method for predicting a voltage of a battery, in particular of a vehicle battery. The method described makes it possible to predict a voltage dip before it actually occurs on account of loading. For this purpose, inter alia, the dynamic internal resistance is used and firstly a filtered battery voltage and a filtered battery current are ascertained. Ohmic voltage drop across the dynamic internal resistance is ascertained from a difference current between the filtered battery current and a predefined load current. A predicted battery voltage is calculated from the filtered battery voltage, minus the ohmic voltage drop and the filtered polarization voltage. However, the document does not describe a specific way of determining the dynamic internal resistance.

WO 2006/057468 A1 discloses a method for estimating values describing present operating conditions of a battery. The method comprises estimating a state of charge in a battery, wherein the state of charge is encompassed by an internal state variable. Furthermore, the method comprises estimating a state of health in a battery, wherein the state of health is encompassed by an internal parameter. The document describes a Kalman filter, wherein the resistance of a battery cell is contained as a state variable or parameter in the Kalman filter.

One disadvantage of such a Kalman filter-based estimation is that inaccuracies resulting from the used model of an energy storage device can lead to an erroneous determination of the internal resistance of the energy storage device. By way of example, inaccuracies in the determination of the state of charge (SOC), the temperature and/or the current can lead to inaccuracies in the determination of the resistance. For this reason, the resistance is not determined in critical operating states, for example at temperatures below 0° C., for states of charge between 0% to 10% and 90% to 100% and in the case of low current flows, for example current flows of less than 10 A.

DE 10 2011 017 113 A1 discloses determining the aging state of a rechargeable battery during operation, e.g. of a vehicle driven by an electric machine. A Kalman filter is used herein, too, namely a triply extended Kalman filter. In the method, a first Kalman filter is used to calculate the state of charge and the fast and slow overvoltages generated by the current, and a second Kalman filter is used to calculate the internal resistance, and a third Kalman filter is used to calculate the cell capacity.

DE 10 2012 010 487 A1 discloses a method for assessing an aging state of a battery using a family of characteristic curves.

EP 1 380 849 B1 discloses a method for ascertaining the quantity of charge in a storage battery that can be drawn in the fully charged state relative to the new state by measurement of battery currents and/or battery voltages at at least two points in time before or during a rise phase and during a decay phase of a charging or discharging process by the determination of a characteristic variable for the quantity of charge that can be drawn from the relationship of at least one battery voltage value from the rise phase to at least one battery voltage value from the decay phase given an approximately identical battery current value or from the relationship of at least one battery current value from the rise phase to at least one battery current value from the decay phase given an approximately identical battery voltage value. This involves evaluating the behavior of the hysteresis obtained by plotting the battery current values and battery voltage values for preferably momentary pulsed loading in the charging or discharging direction in order to deduce from this the quantity of charge that can be drawn from the storage battery.

DE 10 2010 043 870 A1 discloses a converter control unit which responds to a command from a start determination unit to the effect of controlling a converter in such a way that a ripple current is generated at a rechargeable battery. A storage unit stores a family of characteristic curves defining a correlative relationship between the temperature and the current of the rechargeable battery and the internal resistance. An estimation unit estimates a value of an internal resistance of the rechargeable battery on the basis of each detection value of the temperature and current and the family of characteristic curves stored in the storage unit.

DE 10 2012 022 458 A1 discloses a method for monitoring an energy store, wherein operating parameters and/or operating states of the energy store are detected by sensor means and a present relative capacity state of the energy store is ascertained by means of the operating parameters and/or operating states from a first family of characteristic curves assigned to the energy store or by a first calculation function assigned to the energy store. Furthermore, a present relative energy state of the energy store is ascertained by means of the capacity state from a second family of characteristic curves assigned to the energy store or by a second calculation function assigned to the energy store.

SUMMARY OF THE INVENTION

The technical problem addressed is that of determining a method and an apparatus for determining an operating point-dependent change in resistance factor which enable an accurate and reliable determination of a present resistance of the energy storage device for each driving cycle during the entire lifetime of the energy storage device. Furthermore, the technical problem addressed is that of providing a method and an apparatus for determining an operating point-dependent resistance and a vehicle which likewise enable such a determination of the resistance.

The solution to the technical problem is obtained by the subjects having the features of the independent claim(s). Further advantageous embodiments of the invention are evident from the dependent claims.

A method for determining an operating point-dependent change in resistance factor of an energy storage device is proposed. The change in resistance factor can in this case also be referred to as an aging factor. In this case, the change in resistance factor can denote a ratio between the present resistance, in particular an internal resistance, of the energy storage device and a nominal resistance for a specific operating point. In this case, the nominal resistance can be the above-explained BOL (begin of life) resistance that was determined before the initial start-up of the energy storage device, for example by suitable test methods. The energy storage device can be, in particular, a battery cell or a traction battery of a vehicle, wherein the traction battery can in turn comprise a plurality of battery cells. In this case, the energy storage device can store and provide energy for driving operation of the vehicle.

Operating point-dependent nominal resistances can be provided in the form of a family of characteristic curves (nominal family of characteristic curves), for example, wherein a relationship between at least one operating parameter and the nominal resistance is provided by the family of characteristic curves.

In this case, an operating point is characterized by at least one operating parameter, for example a state of charge (SOC) and/or a temperature. Preferably, an operating point is characterized by the state of charge and the temperature. In this case, the nominal family of characteristic curves is a two-dimensional family of characteristic curves.

According to the invention, a start resistance is determined at an operating point start point in time. In this case, the operating point start point in time can denote a point in time at which said operating point is established during the operation of the energy storage device. Consequently, the operating point start point in time can also be a beginning of a driving cycle of the vehicle. In this case, particularly upon the initial start-up of the energy storage device, the start resistance can be equal to the nominal resistance. As explained in even greater detail below, the start resistance can also contain further proportions, however. Consequently, the start resistance is also determined in an operating point-dependent manner.

In this case, a driving cycle denotes a time duration of driving operation of the vehicle or a time duration in which the vehicle is in a state ready for driving or an activated state. Of course, said time duration also encompasses time periods in which the vehicle is in operation but is not travelling. In this regard, the time duration of driving operation can be for example a time duration from a start point in time at which a voltage supply is established for one or a plurality of consumers, for example one or a plurality of controllers and/or an ignition system, until an end point in time at which said voltage supply for the consumer or consumers is interrupted again. However, a driving cycle can also be a time duration from a start point in time at which drawing of energy from the energy storage device for the operation of the vehicle or at least part of the vehicle is begun until an end point in time at which said drawing is ended again.

Furthermore, a change in resistance between a present (operating point-dependent) resistance of the energy storage device and the start resistance, determined in particular for this operating point, is determined at least at an operating point end point in time. The operating point end point in time denotes a point in time at which a change is made to a different operating point during the operation of the energy storage device. This can take place, for example, if the state of charge and/or the temperature change(s), in particular by more than a predetermined amount. The fact that the change in resistance is determined at least at the operating point end point in time does not rule out, as explained in even greater detail below, determining the change in resistance multiply, in particular recursively, between the operating point start point in time and the operating point end point in time.

Furthermore, an (operating point-dependent) end resistance is determined as a sum of the start resistance and the change in resistance determined at the operating point end point in time. Furthermore, the operating point-dependent change in resistance factor is determined as a ratio between the end resistance and a nominal resistance proportion of the start resistance. The nominal resistance proportion of the start resistance can in this case correspond to the nominal resistance explained above.

The operating point-dependent change in resistance factor determined in this way can then be stored. In particular, the operating point-dependent change in resistance factor can be stored in an operating point-dependent manner, in particular in the form of a family of characteristic curves. A relationship between at least one operating parameter and the change in resistance factor can be provided by such a change in resistance factor family of characteristic curves. Preferably, the change in resistance factor family of characteristic curves is also a two-dimensional family of characteristic curves representing a relationship between a state of charge, a temperature and the change in resistance factor. In this case, the change in resistance factor family of characteristic curves can be initialized with the value 1 for each operating point before the initial start-up of the energy storage device.

It goes without saying that a relationship between an operating point and the corresponding change in resistance factor, nominal resistance or start resistance can also be provided in a different form, for example in the form of a function.

If a driving cycle involves passing through a plurality of operating points, then the start resistance, the change in resistance and the change in resistance factor can be determined anew for each of the operating points.

The proposed method advantageously enables an accurate determination and, in particular persistent, storage of the change in resistance factor for different operating points of the energy storage device.

Consequently, the operating point-dependent nominal resistance can be converted into the present operating point-dependent resistance by means of the corresponding operating point-dependent change in resistance factor for each driving cycle and for the entire lifetime of the energy storage device. This in turn enables e.g. an improved determination of a presently permissible power output and thus an increased operational reliability.

In particular, the proposed method makes it possible, even at the beginning of a driving cycle, to carry out in each case an accurate determination of the resistance of the energy storage device taking account of the operating point-dependent change in resistance factor stored last. Consequently, as early as at the beginning of the driving cycle, an operational reliability can be ensured and e.g. an excessively great discharge can be avoided.

In a further embodiment, the start resistance is determined as a sum of a nominal resistance and an initial change in resistance. The nominal resistance has been explained here above.

The initial change in resistance can denote a difference between a resistance of the energy storage device present last at this operating point and the nominal resistance determined at this operating point.

The initial change in resistance can be determined, for example, by the corresponding operating point-dependent nominal resistance being multiplied by the presently stored operating point-dependent change in resistance factor or, as explained in even greater detail below, a corresponding replacement change in resistance factor and then the difference between this product and the operating point-dependent nominal resistance being determined.

This determination of the start resistance can be carried out, in particular, at the beginning of a driving cycle. This advantageously has the result that the change in resistance factor is not necessarily determined on the basis of the nominal resistance, but rather on the basis of a resistance possibly already adapted to an altered resistance.

In a further embodiment, the nominal resistance is determined in an operating point-dependent manner. This has been explained above.

In this case, the nominal family of characteristic curves can have a smaller dimension than the change in resistance family of characteristic curves explained above. In this regard, for example, the number of operating points defined in the nominal family of characteristic curves can be less than the number defined in the change in resistance family of characteristic curves. As a result, memory requirement can advantageously be reduced, an accurate determination of the resistance nevertheless being possible on account of the higher dimensionality of the change in resistance family of characteristic curves.

In a further embodiment, the initial change in resistance is constant for all operating points of a predetermined operating interval. The predetermined operating interval can comprise, in particular, exactly one driving cycle of the vehicle.

If the energy storage device is operated at a plurality of operating points during the predetermined operating interval, then for each operating point the nominal resistance proportion of the start resistance changes, while the initial change in resistance proportion remains constant, however. The initial change in resistance can be determined for example depending on the temporally first operating point of the predetermined operating interval.

This advantageously prevents excessively high jumps in the determination of the change in resistance factor during operation at a plurality of operating points. Overall this enables a temporally faster determination of the change in resistance factor since the initial change in resistance proportion is used as pilot control value.

In a further embodiment, the change in resistance is determined repeatedly, in particular recursively, in the time period between the operating point start point in time and operating point end point in time, wherein the change in resistance is determined anew only if predetermined operating conditions are fulfilled.

This can mean that a change in resistance is determined at an operating point whenever predetermined operating conditions are fulfilled. In this case, the change in resistance can be determined recursively, wherein the newly determined change in resistance is determined depending on the change in resistance determined last. By way of example, the newly determined change in resistance can be determined as a sum of the change in resistance determined last and a deviation proportion, which will be explained in even greater detail below.

Predetermined operating conditions can be fulfilled, for example, if at least one operating parameter, preferably a plurality of operating parameters, lie in a predetermined interval or correspond to a predetermined value.

In this regard, by way of example, a predetermined operating condition can be fulfilled if an energy storage device current is a discharging current and said discharging current has a falling edge. This can mean that a discharging current becomes greater in terms of absolute value.

It goes without saying, however, that further operating conditions, including for other operating parameters, are also conceivable.

What can advantageously be achieved as a result is that changes in resistance are determined only under operating conditions which enable a reliable and accurate determination of the change in resistance. This in turn increases an accuracy of the proposed method.

In a further embodiment, the change in resistance factor is stored. This has been explained above. In this case, the storage of the change in resistance factor is effected only if a frequency of the determination of the change in resistance in the time period between the operating point start point in time and operating point end point in time exceeds a predetermined threshold value. In this case, the threshold value can be greater than one. This in turn means that the change in resistance factor is stored for a subsequent use only if the determination of the change in resistance in an operating point interval is sufficiently accurate, since a sufficient number of determination points in time are present. If the frequency of the determination is less than or equal to the predetermined threshold value, then no determination of the change in resistance factor can be performed or the change in resistance factor then determined can be rejected.

In a further embodiment, the change in resistance factor is stored. This has been explained in greater detail above. Furthermore, time information about a determination point in time of the change in resistance factor is stored in addition to the change in resistance factor. The time information can be provided in the form of a time stamp, for example, which represents a (system) point in time of determination of the change in resistance factor. In this case, the determination point in time can correspond e.g. to the point in time of storage or determination of the change in resistance factor. The change in resistance factor and the associated time stamp can be synchronously detected and stored.

This advantageously has the result that, in addition to the change in resistance factor, time information concerning the last determination thereof is also stored, which subsequently makes it possible to assess the degree to which a stored change in resistance factor is up to date. This in turn makes it possible to increase an accuracy of the proposed method since change in resistance factors that are too old temporally can be disregarded and can be replaced e.g. by replacement change in resistance factors.

In one preferred embodiment, the change in resistance factor is stored in an indexed memory location of a first set of memory locations which is addressed via an operating point-dependent index. Alternatively or cumulatively, time information about a determination point in time of the change in resistance factor is stored in an indexed memory location of a further length of memory locations which is addressed via the operating point-dependent index.

Consequently, the change in resistance factor family of characteristic curves explained above can be an index family of characteristic curves which provides a relationship between the operating point and an operating point-dependent index, wherein, via the index, the change in resistance factor in the first set of memory locations and/or the time information in the further set of memory locations are/is addressed and can thus be retrieved.

This index-based storage advantageously makes it possible that a plurality of operating points exhibiting approximately identical behavior with regard to an aging-governed change in resistance can be combined by the same index being stored in the change in resistance factor family of characteristic curves for said operating points. By way of example, adjacent operating points can thus be combined. As a result, the number of required memory locations in a set of memory locations can be less than the number of operating points. This in turn advantageously makes it possible to reduce memory requirement since now storage of the corresponding change in resistance factor and/or of the time information is not necessary for every operating point.

In this case, as explained above, the same index can be used to address a memory location in the first set of memory locations, which can also be referred to as memory vector, and in the further set of memory locations, which can likewise be referred to as further memory vector. This advantageously has the result that there is no need for two mutually different indices in order to address the change in resistance factor and the corresponding time information.

In a further embodiment, a temperature-normalized replacement change in resistance factor is determined depending on the change in resistance factor and depending on an operating point temperature.

By way of example, the temperature-normalized replacement change in resistance factor can be determined only if the change in resistance factor is also stored. It goes without saying that the temperature-normalized replacement change in resistance factor can likewise be stored, in particular stored in an operating point-dependent manner. In this case, the temperature-normalized replacement change in resistance factor can likewise be stored in the form of an operating point-dependent family of characteristic curves or by means of an index family of characteristic curves in conjunction with corresponding sets of memory locations.

By way of example, the temperature-normalized replacement change in resistance factor can be determined by a conversion factor for the present operating point temperature being determined depending on a previously known assignment between a temperature and a conversion factor, wherein the conversion factor specifies a resistance ratio between the resistance value at the present operating point temperature and the resistance value at a reference temperature, for example a predetermined test temperature.

The previously known assignment can be given in the form of a characteristic curve, for example, by which such a conversion factor can be assigned to an operating point temperature. Such a characteristic curve can have an exponential profile, for example.

This advantageously makes use of the insight that a temperature-dependent alteration of the resistance can be observed during a cyclic loading of the energy storage device. It was possible to observe here, in particular, that the above-explained ratio of the resistance at the present temperature to the resistance at a reference temperature, for example a temperature of 23°, is almost exclusively temperature-dependent and thus only minimally dependent on aging and state of charge.

The temperature-normalized replacement change in resistance factor can thus be normalized to the reference temperature. The temperature-normalized replacement change in resistance factor can then subsequently be used e.g. to determine a change in resistance factor if the change in resistance factor determined last, that is to say the stored change in resistance factor is too old or is not present.

What is advantageously achieved as a result is that, in the case of determination points in time of the change in resistance factor that are temporally too far back in the past, it is possible to use a replacement value for the determination according to the invention of the present change in resistance factor. This increases an accuracy of the proposed method.

In a further embodiment, the temperature-normalized replacement change in resistance factor is determined only if the operating point temperature lies in a predetermined temperature range. By way of example, the temperature-normalized replacement change in resistance factor can be determined only if the operating point temperature lies in a temperature range with a predetermined magnitude around the reference temperature, for example around 23°, for example in a temperature range of 22° (inclusive) to 24° (inclusive).

An estimation error resulting from the characteristic curve explained above can advantageously be reduced as a result. By way of example, it can be assumed that the conversion factor explained above is equal to 1 in the predetermined temperature range.

In a further embodiment, the start resistance is determined depending on a presently stored operating point-dependent change in resistance factor. In this case, the presently stored operating point-dependent change in resistance factor can correspond to the operating point-dependent change in resistance factor determined in a previous driving cycle or the one determined last. In particular, the above-explained initial change in resistance can be determined as a difference between the product of operating point-dependent nominal resistance and presently stored operating point-dependent change in resistance factor and the operating point-dependent nominal resistance, in particular at the beginning of a driving cycle. The start resistance can be determined as a product of operating point-dependent nominal resistance and operating point-dependent presently stored change in resistance factor, in particular at the beginning of a driving cycle.

This advantageously has the result that in any case a start resistance that is as up to date as possible and thus as accurate as possible is determined at the operating point start point in time. This increases firstly the speed of the determination and secondly the accuracy of the determination.

In an alternative embodiment, the start resistance is determined depending on a presently stored operating point-dependent change in resistance factor if a time duration between a present point in time and a determination point in time of the operating point-dependent change in resistance factor determined last is less than or equal to a predetermined time duration. In this case, the presently stored operating point-dependent change in resistance factor can correspond in particular identically to the change in resistance factor determined last.

In this case, the determination point in time was explained above and can likewise be stored, for example. In this case, the predetermined time duration can be chosen in an application- or user-specific manner. This means in other words that the presently stored operating point-dependent change in resistance factor is used for determining the start resistance only if the operating point-dependent change in resistance factor is still sufficiently up to date.

Furthermore, the start resistance is determined depending on a replacement change in resistance factor if the time duration between a present point in time and a determination point in time of the operating point-dependent change in resistance factor determined last is greater than the predetermined time duration.

If the change in resistance factor stored last is no longer sufficiently up to date, then in its place a replacement change in resistance factor is used for determining the start resistance. This replacement change in resistance factor can be determined depending on the above-explained temperature-normalized replacement change in resistance factor stored last. This advantageously increases the accuracy of the resistance determination.

In a further embodiment, the replacement change in resistance factor is determined depending on a present operating point temperature. As explained above, for this purpose it is possible again to determine a conversion factor depending on a characteristic curve, which conversion factor specifies the ratio of the resistance at the present operating point temperature to the resistance at a reference temperature. By way of example, in this case, the above-explained temperature-normalized replacement change in resistance factor can be converted into a replacement change in resistance factor for a present operating point temperature depending on the conversion factor.

This advantageously results in a reliable determination of the replacement change in resistance factor.

In a further embodiment, the change in resistance of the energy storage device is determined depending on the change over time in a deviation between a model voltage and a measurement voltage. The measurement voltage of the energy storage device can be, for example, an output voltage of the energy storage device that is detected by means of a corresponding detection device, in particular by means of a voltage sensor. In this case, however, the term "detect" encompasses both the direct detection of the measurement voltage and a determination of the measurement voltage depending on a further, in particular directly, detected electrical variable.

The model voltage can be determined, in particular determined in a model-based manner. The model voltage can likewise model a model output voltage of the energy storage device. The model voltage can denote e.g. an estimated output voltage of the energy storage device. The model voltage can be determined in particular depending on a preferably, but not necessarily, dynamic model of the energy storage device. The model can map for example a relationship between the model voltage and at least one operating parameter of the energy storage device. An operating parameter can be, as explained above, a state of charge, a temperature and a current of the energy storage device. In this case, the current of the energy storage device can be a charging or discharging current.

Furthermore, such a model can comprise at least one characteristic variable, which can also be referred to as model parameter. A characteristic variable can be, in particular, the resistance of the energy storage device. A further characteristic variable can be, for example, a time constant of a dynamic charging or discharging behavior.

Furthermore, a deviation between the model voltage and the measurement voltage is determined, wherein the deviation can be determined for example as a difference between the model voltage and the measurement voltage.

Furthermore, a change in the deviation over time is determined, wherein the change in resistance of the energy storage device is determined depending on the change in the deviation over time. The change in the deviation over time can denote a quantitative value of the change over time.

In addition, a measurement current of the energy storage device can be detected. This can be carried out for example by means of a suitable detection device, in particular by means of a current sensor. In this case, the measurement current can be a charging or discharging current of the energy storage device. In this case, it can be assumed, for example, that a charging current has a positive sign, a discharging current having a negative sign. The model voltage can be determined for example depending on the measurement current detected in this way. Furthermore, a change in the measurement current over time can also be determined, wherein the change in resistance is additionally determined depending on the change in the measurement current over time.

Consequently, the change in resistance is not determined depending on the deviation between the model voltage and the measurement voltage, but rather depending on a change in said deviation over time. This means, in particular, that an offset between the model voltage and the measurement voltage does not lead to an assumption of an altered resistance if said offset is constant over time, in particular even during dynamic processes, in particular charging or discharging processes.

The change in resistance of the energy storage device can be determined for example depending on the change in the deviation over time by virtue of the change in the deviation over time being multiplied by a constant or variable, in particular operating point-dependent, gain factor. Operating point-dependent gain factors can be determined for example by simulation or by test bed-based determination methods.

In addition, the change in resistance of the energy storage device can be determined depending on the change in the deviation over time by a procedure in which a change in resistance determined at a present point in time is determined depending on a change in resistance determined at least at a previous point in time and the change in the deviation over time multiplied by the gain factor.

Moreover, the change in resistance of the energy storage device can be determined depending on the change in the deviation over time by the change in resistance being determined as division of the change in the deviation over time by the change in the measurement current over time. Such a determination of the change in resistance can be carried out, in particular, only if the change in the measurement current over time is greater than zero and the change over time takes place in a consideration time period that is shorter than a predetermined (small) time duration, for example shorter than 100 ms, shorter than 50 ms or shorter than 20 ms. Preferably, the time duration of the consideration time period is 10 ms.

This advantageously prevents static deviations between the model voltage and the measurement voltage from influencing the determination of the change in resistance. Consequently, the change in resistance is determined independently of said static deviations. This can be carried out, in particular, under the assumption that an assumed resistance is equal to the real battery internal resistance if no change in the deviation over time occurs. Consequently, overall an accurate and reliable determination of the change in resistance advantageously results, in particular independently of static deviations between model voltage and measurement voltage.

Furthermore, the determination of the change in resistance can be carried out only if an absolute value of the change in the deviation over time is greater than a predetermined threshold value, for example greater than zero.

Furthermore, a measurement current can be detected, wherein the determination of the change in resistance is carried out only if an absolute value of the change in the measurement current over time is greater than a predetermined threshold value, in particular greater than zero.

Furthermore, the determination of the change in resistance can be carried out only if the measurement current is a discharging current and the discharging current rises in terms of absolute value. It goes without saying that it is also possible, however, to carry out the determination of the change in resistance if the measurement current is a discharging current and the discharging current decreases in terms of absolute value. It is also conceivable for the determination of the change in resistance to be carried out if the measurement current is a charging current and the charging current rises or decreases in terms of absolute value.

Furthermore, the change in resistance can be determined at a plurality of successive points in time, wherein the change in resistance at a present point in time is determined depending on the change in resistance at at least one previous point in time. In particular, the change in resistance can be determined recursively.

By way of example, the change in resistance at a present point in time can be determined depending on the change in resistance at at least one previous point in time by a procedure in which the product of gain factor and the change in the deviation over time is added to the change in resistance that was determined at the directly preceding point in time.

Furthermore, the change in resistance at the present point in time can be determined as a manipulated variable of a control specification, wherein the change over time in the deviation between the model voltage and the measurement voltage corresponds to the reference variable of the control specification.

Furthermore, the change in the deviation over time and the change in the measurement current over time can be filtered.

Furthermore, a correction voltage for the model voltage can be determined depending on the deviation between the model voltage and the measurement voltage. By way of example, the model voltage determined at a present point in time can then additionally be determined depending on the correction voltage determined at a previous point in time, in particular the correction voltage determined at the directly preceding point in time. The model voltage corrected in this way can then in turn be used at the present point in time for determining the change in resistance. In addition, it is possible that the model voltage corrected in this way can also be used for further open-loop and closed-loop control processes in the vehicle, for example for controlling the power output and/or for predicting an available power.

Furthermore, it is conceivable to assign proportions of the correction voltage to individual elements of the model for determining the model voltage. By way of example, it is thus possible to determine correction factors for inaccurate OCV (open circuit voltage) families of characteristic curves.

Furthermore, the correction voltage can be determined as a manipulated variable of a control specification, wherein the deviation between the model voltage and the measurement voltage corresponds to the reference variable of the control specification. The control specification can be, in particular, a control specification of an I controller or of a PI controller. This advantageously results in a determination of the correction voltage that is as accurate and reliable as possible.

Furthermore, a model voltage can be determined depending on a present resistance of the energy storage device and depending on at least one operating parameter, preferably depending on a state of charge, a temperature and a charging or discharging current, of the energy storage device. In this case, the present resistance can represent a model parameter of the model. Further model parameters can be, for example, time constants that characterize dynamic voltage changes in the output voltage of the energy storage device.

Also proposed is a method for determining an operating point-dependent resistance of an energy storage device, wherein the operating point-dependent resistance is determined depending on a presently stored operating point-dependent change in resistance factor. In this case, the presently stored operating point-dependent change in resistance factor can correspond to the change in resistance factor determined last for this operating point. However, it is also conceivable for the presently stored operating point-dependent change in resistance factor to correspond to an initial value, for example an initial value of 1. Furthermore, the change in resistance factor is determined by a method according to one of the embodiments explained above.

Also proposed is a method for determining an operating point-dependent resistance of an energy storage device, wherein the operating point-dependent resistance is determined depending on a presently stored operating point-dependent change in resistance factor if a time duration between a present point in time and a determination point in time of the operating point-dependent change in resistance factor determined last is less than or equal to a predetermined time duration. The operating point-dependent resistance is determined depending on a replacement change in resistance factor if the time duration between a present point in time and a determination point in time of the operating point-dependent change in resistance factor determined last is greater than the predetermined time duration. This has already been explained above with regard to the determination of the operating point-dependent change in resistance factor. The change in resistance factor can be determined by a method according to one of the embodiments explained above. The replacement change in resistance factor can be determined as explained above.

Also proposed is an apparatus for determining an operating point-dependent change in resistance factor of an energy storage device, wherein the apparatus comprises at least one evaluation device.

According to the invention, in particular by means of the evaluation device, a start resistance is determinable at an operating point start point in time, wherein a change in resistance between a present resistance of the energy storage device and the start resistance is determinable at least at an operating point end point in time, wherein an end resistance is determinable as a sum of the start resistance and the change in resistance determined at the operating point end point in time. The operating point-dependent change in resistance factor is determinable as a ratio between the end resistance and a nominal resistance proportion of the start resistance.

In this case, the apparatus can likewise serve for determining an operating point-dependent resistance. In this case, the apparatus is embodied in such a way that a method according to one of the embodiments explained above can be performed by the apparatus.

Furthermore, the apparatus can comprise at least one memory device for storing the operating point-dependent change in resistance factor.

BRIEF DESCRIPTION OF THE DRAWINGS

The invention will be explained in greater detail on the basis of an exemplary embodiment. In the figures.

DETAILED DESCRIPTION OF THE INVENTION

Hereinafter, identical reference signs denote elements having identical or similar technical features.

Figure 1:
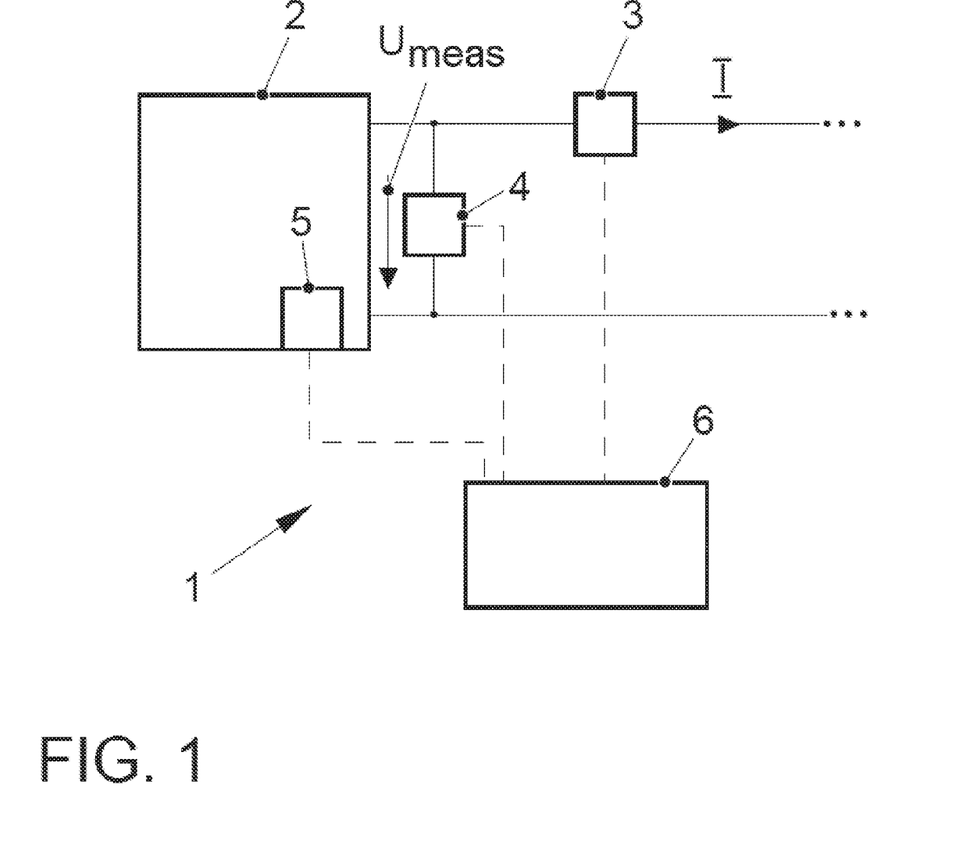
FIG. 1 shows a schematic block diagram of an apparatus according to the invention.

FIG. 1 illustrates a schematic block diagram of an apparatus 1 according to the invention, which can be part of a vehicle (not illustrated). An energy storage device 2 is illustrated, which can be for example a battery cell of a traction battery.

The apparatus 1 comprises a current sensor 3 for detecting a measurement current I, which denotes a charging or discharging current. Furthermore, the apparatus 1 comprises a voltage sensor 4 for detecting a measurement voltage Umeas, wherein the measurement voltage Umeas constitutes an output voltage of the energy storage device 2. Furthermore, the apparatus 1 comprises a temperature sensor 5 for detecting an operating temperature of the energy storage device 2. Furthermore, the apparatus 1 comprises an evaluation device 6. The evaluation device 6 is connected to the temperature sensor 5, the voltage sensor 4 and the current sensor 3 data-and/or signal-technologically, which is illustrated by dashed lines. The method explained below can be carried out by means of the evaluation device 6.

Figure 2:
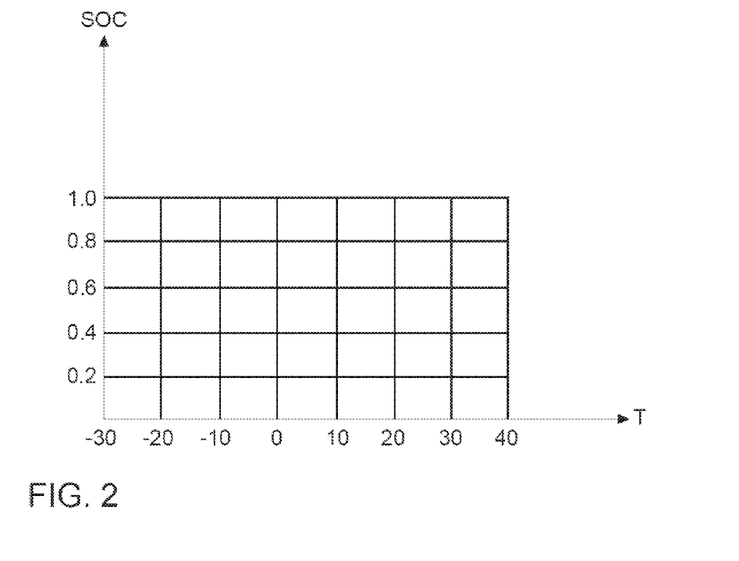
FIG. 2 shows an exemplary change in resistance factor family of characteristic curves.

FIG. 2 illustrates one exemplary change in resistance factor family of characteristic curves of an energy storage device 2 (see FIG. 1). The change in resistance factor family of characteristic curves illustrated in this case comprises 35 operating points, wherein an operating point is given by a temperature T and a state of charge SOC. By way of example, an operating point is provided if a temperature is between 0° C. and 10° C. and a state of charge is between 0.2 and 0.4.

In this change in resistance factor family of characteristic curves, each operating point can respectively be assigned an index IX, wherein the index IX (see FIG. 3a) can assume values of from 0 to 9, for example. As explained in even greater detail with reference to FIG. 3a and FIG. 3b, such an index IX can address a memory location in a set SM1, SM2 of memory locations, wherein a change in resistance factor AF and/or a time stamp can be stored at this addressed memory location.

In this case, a nominal family of characteristic curves (not illustrated) can be embodied in a manner similar to the change in resistance factor family of characteristic curves illustrated in FIG. 2, wherein each operating point can be assigned a nominal resistance which is determined or allocated prior to an initial start-up. Said nominal resistance can also be referred to as BOL (begin of life) resistance and can likewise be determined depending on the temperature T and the state of charge SOC. In this case, it is possible for the change in resistance factor family of characteristic curves to have more operating points than the nominal family of characteristic curves.

For one of the operating points illustrated in FIG. 2, the assumption can hold true that aging of the resistance within an operating point should be regarded as constant.

Different operating points can be traversed during each driving cycle. By way of example, a first operating point of a driving cycle can be defined by a temperature of 0° C. to 10° C. and a state of charge of 0.8 to 1.0. Subsequent operating points can be given for example by decreasing states of charge, for example states of charge of between 0.6 and 0.8 and 0.4 to 0.6, wherein the temperature still lies between 0° C. and 10° C. An operating point-dependent change in resistance factor $AF_{AP}$ can then be determined for each of these operating points, which will be explained in even greater detail below.

Figure 3A:
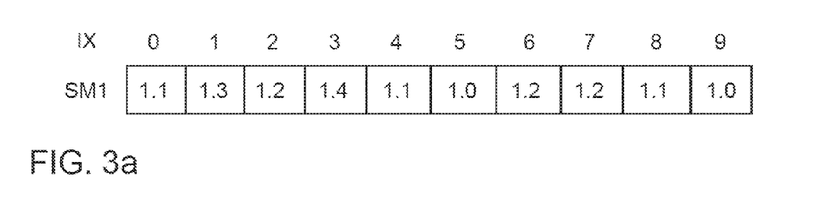
FIG. 3a shows an exemplary first set of memory locations.

FIG. 3a illustrates a first set SM1 of memory locations, which comprises memory locations addressed in each case by an index IX of from 0 to 9. Values of a change in resistance factor AF for the individual memory locations are illustrated by way of example.

Figure 3B:
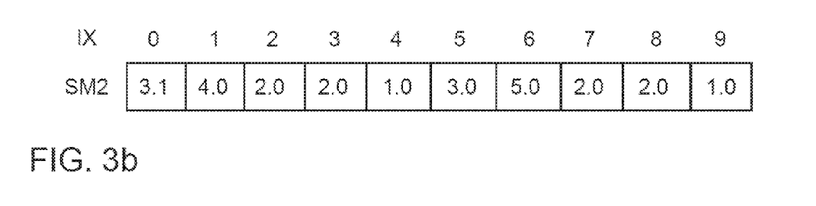
FIG. 3b shows an exemplary further set of memory locations.

FIG. 3b illustrates a corresponding further set SM2 of memory locations, which likewise comprises memory locations addressed by an index IX of from 0 to 9. By way of example, time stamps containing the point in time at which the change in resistance factor AF was determined or stored last can be stored in said further memory locations of the further set SM2 of memory locations.

In this case, the sets SM1, SM2 of memory locations can be provided by a RAM memory device during a run time of the method, wherein after the conclusion of the method, for example at the end of a driving cycle or when a corresponding evaluation device is switched off or deactivated, transfer into an EEPROM memory device can take place.

Figure 4:
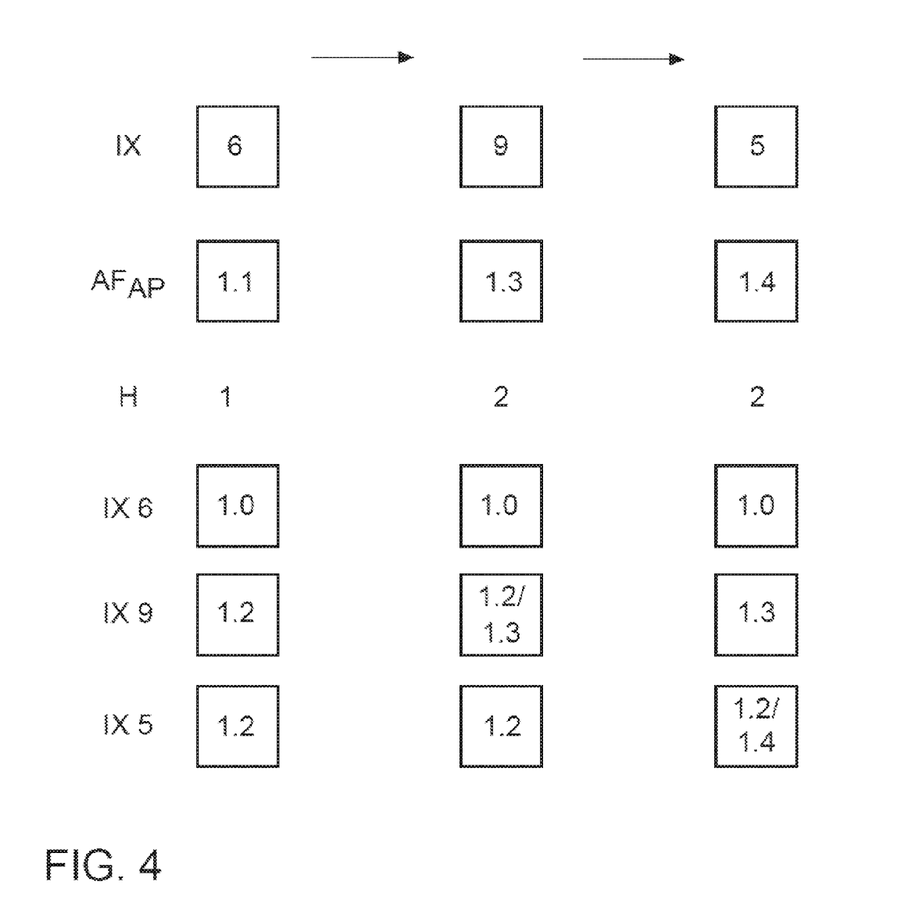
FIG. 4 shows a schematic flow diagram of a method according to the invention.

FIG. 4 illustrates a first exemplary flow diagram of a method according to the invention. In a first line, operating points are represented by the corresponding indices IX 6, 9 and 5. This means that, in the driving cycle illustrated, the energy storage device 2 (see FIG. 1) is firstly operated in an operating point to which the index 6 is allocated. The operation of the energy storage device 2 correspondingly changes into an operating point to which the index 9 is allocated. The operation thereafter changes into an operating point to which the index 5 is allocated. A second line illustrates the operating point-dependent change in resistance factors $AF_{AP}$ presently determined in each case, wherein the change in resistance factor $AF_{AP}$ determined at the first operating point is 1.1, the change in resistance factor $AF_{AP}$ determined at the second operating point is 1.3 and the change in resistance factor $AF_{AP}$ determined at the third operating point is 1.4.

A third line illustrates in each case the number of the frequency H with which a change in resistance $\Delta R$, explained in even greater detail below, is determined during operation at the respective operating point. This means that, at the first operating point, a change in resistance $\Delta R$ was determined only at one point in time. At the second operating point, a change in resistance $\Delta R$ was determined at two points in time. At the third operating point, a change in resistance $\Delta R$ was likewise determined at two points in time.

In this case, the change in resistance $\Delta R$ is determined at an operating point only if predetermined operating conditions are fulfilled, in particular if discharging current I flows and the latter has a falling edge.

A fourth line illustrates the presently stored change in resistance factors AF illustrated for the operating points to which the index IX 6 is allocated. A fifth line illustrates the presently stored change in resistance factors AF for the operating points to which the index IX 9 is allocated. A sixth line correspondingly illustrates the change in resistance factors of the operating points to which the index IX 5 is allocated.

It is true that a change in resistance factor $AF_{AP}$ of 1.1, different from the presently stored change in resistance factor AF of 1.0, was determined at the first operating point. However, since the frequency of the determination of the change in resistance $\Delta R$ is less than a predetermined threshold value, namely less than 2, this newly determined change in resistance factor $AF_{AP}$ is not stored.

At the second operating point, to which the index 9 is allocated, a change in resistance factor $AF_{AP}$ of 1.3 is determined, which is different from the previously stored change in resistance factor AF of 1.2. Since the number of determinations of the change in resistance $\Delta R$ is greater than 1, the newly determined change in resistance factor $AF_{AP}$ is stored. Correspondingly, the change in resistance factor $AF_{AP}$ of 1.4 determined at the third operating point is also stored.

Figure 6:
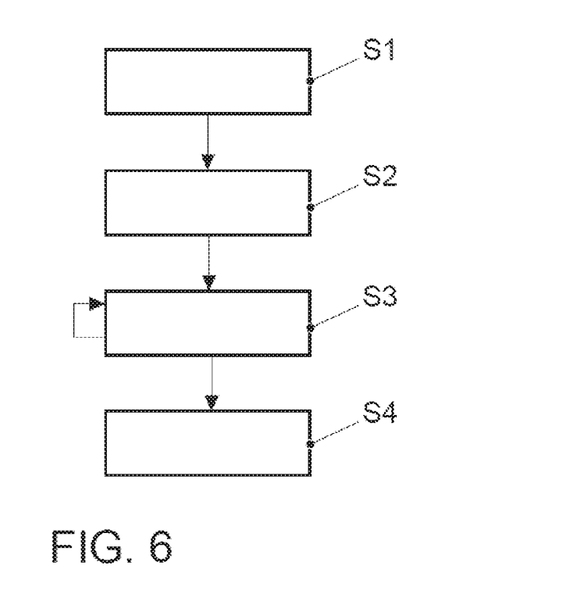
FIG. 6 shows a schematic flow diagram of a method according to the invention.

FIG. 6 illustrates a further exemplary flow diagram of a method according to the invention. A first step S1 involves an initialization, for example of a corresponding evaluation device 6 (see FIG. 1) for carrying out the method according to the invention. In this case, the evaluation device 6 can be provided for example by a controller in the vehicle. During the initialization, for example, the above-explained change in resistance factor family of characteristic curves and the sets SM1, SM2 of memory locations can be transferred from the EEPROM memory device likewise explained above into a RAM memory device.

The determination of a present change in resistance factor $AF_{AP}$ and of a present resistance of the energy storage device 2 begins in a second step. For this purpose, a present operating point is determined, in particular depending on a present temperature T and a present state of charge SOC. A presently stored change in resistance factor $AF_{AP}$ or a replacement change in resistance factor $EAF_{AP}$ can then be determined depending on the operating point.

In this case, the replacement change in resistance factor $EAF_{AP}$ can be determined if a time duration between the present point in time and the point in time of the last determination of the change in resistance factor $AF_{AP}$ is greater than a predetermined time duration. If the time duration between the present point in time and the point in time of the last determination of the change in resistance factor $AF_{AP}$ is less than or equal to the predetermined time duration, however, then the stored change in resistance factor AF can be read out in an operating point-dependent manner from the explained first set SM1 of memory locations via the index IX in the change in resistance factor family of characteristic curves. Alternatively, it is possible, in this case, too, to determine the replacement change in resistance factor $EAF_{AP}$ and then to determine a minimum from the stored change in resistance factor $AF_{AP}$ and the replacement change in resistance factor $EAF_{AP}$, wherein the minimum is then used as operating point-dependent change in resistance factor $AF_{AP}$.

A present resistance, in particular the present resistance at the driving cycle start point in time, of the energy storage device 2s can then be determined as follows:

$$R0_i = R0_{AP} \times \min(AF_{AP}, EAF_{AP}) \quad \text{Formula 1}$$

In this case, $R0_i$ denotes the present resistance and $R0_{AP}$ denotes the operating point-dependent nominal resistance. Alternatively, the present resistance can be determined as $$R0_i = R0_{AP} \times AF_{AP} \quad \text{Formula 2}$$

if the time duration between the present point in time and the point in time of the first determination of the change in resistance factor $AF_{AP}$ is less than or equal to the predetermined time duration.

If the time duration is greater than the predetermined time duration, then the present resistance can be determined as $$R0_i = R0_{AP} \times EAF_{AP} \quad \text{Formula 3}$$

Depending on the present resistance $R0_i$, an initial change in resistance can then be determined as $$\Delta R0 = R0_i - R0_{AP} \quad \text{Formula 4}$$

This initial change in resistance $\Delta R0$ is determined at the start point in time of the method and then holds true for all subsequent operating points of a driving cycle.

The determination of the replacement change in resistance factor EAF is explained in even greater detail below.

A third step S3 involves cyclic operation of the energy storage device 2, that is to say charging operation or discharging operation. In said cyclic operation, for each operating point an operating point-dependent change in resistance factor is determined in accordance with $$AF_{AP} = (R0_{AP} + \Delta R0 + \Delta R)/R0_{AP} \quad \text{Formula 5}$$

In this case, $R0_{AP}$ denotes the operating point-dependent nominal resistance, wherein $\Delta R0$ describes the initial change in resistance explained above.

Furthermore, the change in resistance $\Delta R$ between a start resistance determined at the operating point start point in time and a present resistance of the energy storage device 2 is determined depending on a change over time in a deviation between a model voltage and a measurement voltage. The change in resistance $\Delta R$ at a point in time can be determined for example in accordance with $$\Delta R(k) = \Delta R(k-1) + kd \times Ud(k) \quad \text{Formula 6}$$

wherein kd denotes a constant or operating point-dependent, previously known gain factor and k denotes a (discrete) point in time. The change in the deviation can be determined in accordance with $$Ud(k) = Ue(k) - Ue(k-1) \quad \text{Formula 7}$$

wherein Ue(k) is determined in accordance with $$Ue(k) = Umod(k) - Umeas(k) \quad \text{Formula 8}$$

wherein Umeas(k) denotes a measurement voltage and Umod(k) denotes a model voltage of the output voltage of the energy storage device 2.

The start resistance is determined as the sum of the operating point-dependent nominal resistance $R0_{AP}$ and the initial change in resistance $\Delta R0$ explained above. In this case, however, the start resistance is determined anew for each operating point, in which case, however, exclusively the nominal resistance $R0_{AP}$ but not the initial change in resistance $\Delta R0$ is determined anew.

In this case, the change in resistance $\Delta R$ is determined repeatedly, in particular recursively, during operation at an operating point, wherein the change in resistance $\Delta R$ is determined anew only if the operating conditions explained above are fulfilled.

If a frequency of the renewed determination lies above the specific threshold value explained above, for example above the threshold value of 1, then the newly determined change in resistance factor $AF_{AP}$ can be stored at the operating point end point in time if it differs from the previously stored change in resistance factor $AF_{AP}$.

In this case, at the same time, a temperature-normalized replacement change in resistance factor nEAF can also be determined as follows:

$$nEAF=(AF_{AP}-1)/TF(T_{AP}) \quad \text{Formula 9}$$

wherein TF denotes a function by which a ratio between a resistance of the energy storage device 2 at a present temperature $T_{AP}$ to the resistance of the energy storage device 2 at a reference temperature, for example 23°, is determinable. This temperature-normalized replacement change in resistance factor nEAF can also be stored.

Alternatively, it is possible to determine said temperature-normalized replacement resistance factor nEAF only if the present operating point temperature $T_{AP}$ lies in a predetermined interval around the reference temperature or corresponds to the reference temperature. In this case, the temperature-normalized replacement change in resistance factor nEAF is determined as $$nEAF=(AF_{AP}-1) \quad \text{Formula 10.}$$

Depending on this temperature-normalized replacement change in resistance factor nEAF, an operating point-dependent replacement change in resistance factor $EAF_{AP}$ can then be determined as $$EAF_{AP}=(1+nEAF \times TF(T_{AP})) \quad \text{Formula 11}$$

The change in resistance factors $AF_{AP}$ determined in this way for one or a plurality of operating points can then be stored in the RAM memory device explained above.

In a fourth step S4, e.g. when the evaluation device 6 is deactivated or switched off, the change in resistance factors $AF_{AP}$ stored in the RAM memory device can be transferred into the EEPROM memory device.

Figure 5:
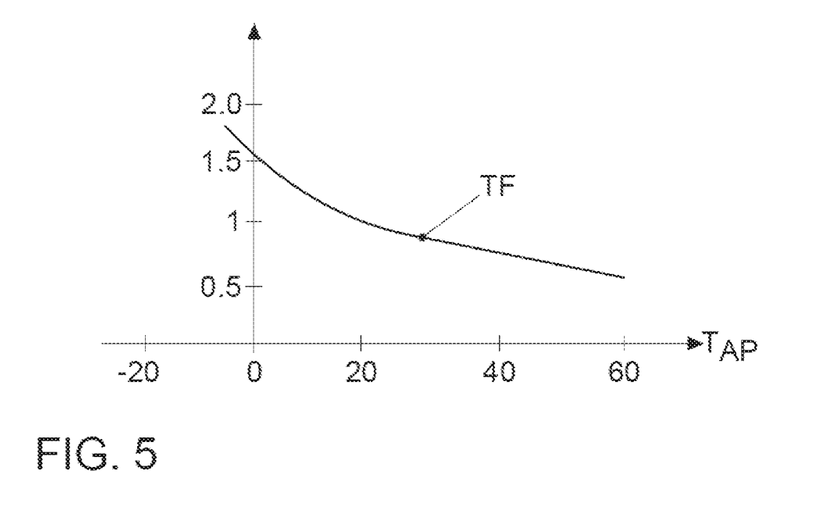
FIG. 5 shows an exemplary profile of a resistance ratio characteristic curve.

FIG. 5 illustrates an exemplary temperature function TF via which a conversion factor between a present resistance of the energy storage device 2 at the operating point temperature $T_{AP}$ and a resistance of the energy storage device 2 at the reference temperature can be determined depending on a present operating point temperature $T_{AP}$.

In the context of observations it was possible to establish that said temperature function is only minimally dependent on state of charge and aging. The temperature function, which can be given in particular in the form of a characteristic curve, can be determined for example by means of suitable methods prior to the start-up of the energy storage device 2, for example during a parameterization of the battery, in particular by means of a so-called RIPA test.

In this case, it is possible to store the temperature-normalized replacement change in resistance factor during initialization with a predetermined value, for example a value of 0×00 (hexadecimal).

In particular, it is thus possible to avoid a situation in which, in a first driving cycle, the temperature-normalized replacement change in resistance factor nEAF is not used for determining the present resistance or the start resistance.

In this case, the proposed method can be carried out in the vehicle at the battery cell level or else at the battery level, wherein a battery can consist of a plurality of battery cells.

Overall, the proposed method enables an online calculation of operating point-dependent change in resistance factors AF, which can also be referred to as aging factors. The latter can be stored persistently. Furthermore, the change in resistance factors AF already learned can be used for subsequent calculations, in particular at the beginning of a new driving cycle.

It is conceivable, of course, to use further operating parameters for determining the operating point besides the operating parameters of temperature T and state of charge SOC mentioned by way of example. For example, a current of the energy storage device 2 can also be used for characterizing an operating point.

Depending on the method, e.g. individual battery cells of a traction battery the change in resistance factor AF can be estimated. Since it can be assumed that greatly aged battery cells have a high change in resistance factor AF, such a battery cell can then be identified and exchanged in a targeted manner. This advantageously results in a cost saving in comparison with the exchange of the entire traction battery.

Furthermore, the proposed method advantageously makes it possible to specifically control operation of a battery cell. This makes it possible, for example, to control battery cells in an aging-dependent manner in such a way that a battery cell outputs or takes up power according to its age. This in turn can advantageously lead to a lifetime of an individual cell being increased.

Furthermore, the method described can be used in a similar manner to measure further characteristic variables of an energy storage device 2. By way of example, a battery model having an internal resistance and one or a plurality of RC elements can be used, wherein an RC element maps a dynamic behavior of the energy storage device 2. It is possible, by means of the method described, to estimate change factors of characteristic variables and/or characteristic variables of the RC element, for example a gain and/or a time constant.

Model elements or model parameters not yet known hitherto can also be estimated by means of the proposed method.

It is also conceivable to take account of aging-governed alterations of the temperature function. Moreover, it is possible to take account of a change in the temperature function depending on a state of charge SOC.

LIST OF REFERENCE SIGNS

1 Apparatus
2 Energy storage device
3 Current sensor
4 Voltage sensor
5 Temperature sensor
6 Evaluation device SOC State of charge
T Temperature
$T_{AP}$ Operating point temperature
TF Temperature function
S1 First step
S2 Second step
S3 Third step
S4 Fourth step
IX Index
H Frequency
SM1 First set of memory locations
SM2 Further set of memory locations
$AF_{AP}$ operating point-dependent change in resistance factor Having described the invention, the following is claimed:

1. Method for determining an operating point-dependent change in resistance factor ($AF_{AP}$) of an energy storage device, wherein the method comprises:
   determining a start resistance at an operating point start point in time,
   determining a change in resistance between a present resistance of the energy storage device and the start resistance at least at an operating point end point in time,
   determining an end resistance as a sum of the start resistance and the change in resistance determined at the operating point end point in time,
   wherein the operating point-dependent change in resistance factor ($AF_{AP}$) is determined as a ratio between the end resistance and a nominal resistance proportion of the start resistance.

2. Method according to claim 1, wherein the start resistance is determined as a sum of a nominal resistance and an initial change in resistance.

3. Method according to claim 1, wherein the nominal resistance is determined in an operating point-dependent manner.

4. Method according to claim 1, wherein the initial change in resistance is constant for all operating points of a predetermined operating interval.

5. Method according to claim 1, wherein the change in resistance is determined repeatedly in the time period between the operating point start point in time and operating point end point in time, wherein the change in resistance is determined anew only if predetermined operating conditions are fulfilled.

6. Method according to claim 5, wherein the method further comprises:
   storing the operating point-dependent change in resistance factor ($AF_{AP}$), wherein the storage of the operating point-dependent change in resistance factor ($AF_{AP}$) is effected only if a frequency of the determination of the change in resistance in the time period between the operating point start point in time and operating point end point in time exceeds a predetermined threshold value.

7. Method according to claim 1, wherein the method further comprises:
   storing the operating point-dependent change in resistance factor ($AF_{AP}$), wherein time information about a determination point in time of the operating point-dependent change in resistance factor ($AF_{AP}$) is stored in addition to the operating point-dependent change in resistance factor ($AF_{AP}$).

8. Method according to claim 1, wherein the method further comprises:
   storing the operating point-dependent change in resistance factor ($AF_{AP}$) in an indexed memory location of a first set (SM1) of memory locations which is addressed via an operating point-dependent index (IX), and/or storing the time information about a determination point in time of the operating point-dependent change in resistance factor ($AF_{AP}$) in an indexed memory location of a further set (SM2) of memory locations which is addressed via the operating point-dependent index (IX).

9. Method according to claim 1, wherein the method further comprises:
   determining a temperature-normalized replacement change in resistance factor depending on the operating point-dependent change in resistance factor ($AF_{AP}$) and depending on an operating point temperature ($T_{AP}$).

10. Method according to claim 9, wherein the temperature-normalized replacement change in resistance factor is determined only if the operating point temperature ($T_{AP}$) lies in a predetermined temperature range.

11. Method according to claim 1, wherein the start resistance is determined depending on a presently stored operating point-dependent change in resistance factor ($AF_{AP}$).

12. Method according to claim 1, wherein the start resistance is determined depending on a presently stored operating point-dependent change in resistance factor ($AF_{AP}$) if a time duration between a present point in time and a determination point in time of the operating point-dependent change in resistance factor ($AF_{AP}$) determined last is less than or equal to a predetermined time duration,
   wherein the start resistance is determined depending on a replacement change in resistance factor if the time duration between a present point in time and a determination point in time of the operating point-dependent change in resistance factor ($AF_{AP}$) determined last is greater than the predetermined time duration.

13. Method according to claim 12, wherein the replacement change in resistance factor is determined depending on a present operating point temperature ($T_{AP}$).

14. Method according to claim 1, wherein the change in resistance of the energy storage device is determined depending on the change over time in a deviation (Ue) between a model voltage and a measurement voltage (Umeas).

15. Method for determining an operating point-dependent resistance of an energy storage device, wherein the method comprises:
   determining an operating point-dependent resistance depending on a presently stored operating point-dependent change in resistance factor ($AF_{AP}$), wherein the operating point-dependent change in resistance factor ($AF_{AP}$) is determined according to the steps:
   determining a start resistance at an operating point start point in time,
   determining a change in resistance between a present resistance of the energy storage device and the start resistance at least at an operating point end point in time,
   determining an end resistance as a sum of the start resistance and the change in resistance determined at the operating point end point in time,
   wherein the operating point-dependent change in resistance factor ($AF_{AP}$) is determined as a ratio between the end resistance and a nominal resistance proportion of the start resistance.

16. Method for determining an operating point-dependent resistance of an energy storage device, wherein the method comprises:

determining an operating point-dependent resistance depending on a presently stored operating point-dependent change in resistance factor ($AF_{AP}$) if a time duration between a present point in time and a determination point in time of the operating point-dependent change in resistance factor ($AF_{AP}$) determined last is less than or equal to a predetermined time duration, wherein the operating point-dependent resistance is determined depending on a replacement change in resistance factor if the time duration between a present point in time and a determination point in time of the operating point-dependent change in resistance factor ($AF_{AP}$) determined last is greater than the predetermined time duration.

17. Apparatus for determining an operating point-dependent change in resistance factor ($AF_{AP}$) of an energy storage device, wherein the apparatus comprises:

at least one evaluation device, wherein a start resistance is determinable at an operating point start point in time, wherein a change in resistance between a present resistance of the energy storage device and the start resistance is determinable at least at an operating point end point in time, wherein an end resistance is determinable as a sum of the start resistance and the change in resistance determined at the operating point end point in time, and wherein the operating point-dependent change in resistance factor ($AF_{AP}$) is determinable as a ratio between the end resistance and a nominal resistance proportion of the start resistance.

* * * * *